(12) United States Patent
Kato

(10) Patent No.: US 6,284,595 B1
(45) Date of Patent: Sep. 4, 2001

(54) METHOD FOR FABRICATING STACKED CAPACITOR HAVING EXCELLENT ANTI-OXIDATION PROPERTY

(75) Inventor: Yoshitake Kato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/559,412

(22) Filed: Apr. 26, 2000

(30) Foreign Application Priority Data

Apr. 30, 1999 (JP) .................................................. 11-124444

(51) Int. Cl.⁷ ................................................ H01L 21/8242
(52) U.S. Cl. ................................ 438/253; 438/254; 438/3
(58) Field of Search ......................... 438/3, 238–240, 438/253–256, 381, 393–399

(56) References Cited

U.S. PATENT DOCUMENTS 5,474,951 * 12/1995 Han et al. .
5,550,077 * 8/1996 Tseng et al. .

* cited by examiner

*Primary Examiner*—Jey Tsai
(74) *Attorney, Agent, or Firm*—McGinn & Gibb, PLLC

(57) ABSTRACT

A stacked capacitor includes a top electrode, a capacitor insulator film made of BST, and a bottom electrode having a hollow cylindrical shape and connected through a contact plug to a diffused region of a silicon substrate. The bottom electrode includes a barrier layer, a first electrode layer and a second electrode layer, wherein the first and the second electrode layers are deposited on the barrier layer, followed by patterning of the second electrode layer for forming a hollow therein. The contact resistance between the bottom electrode and the contact plug is low due to excellent crystalline orientation alignment of the first electrode layer and thus prevention of oxidation of the contact plug during deposition of the BST film.

6 Claims, 8 Drawing Sheets

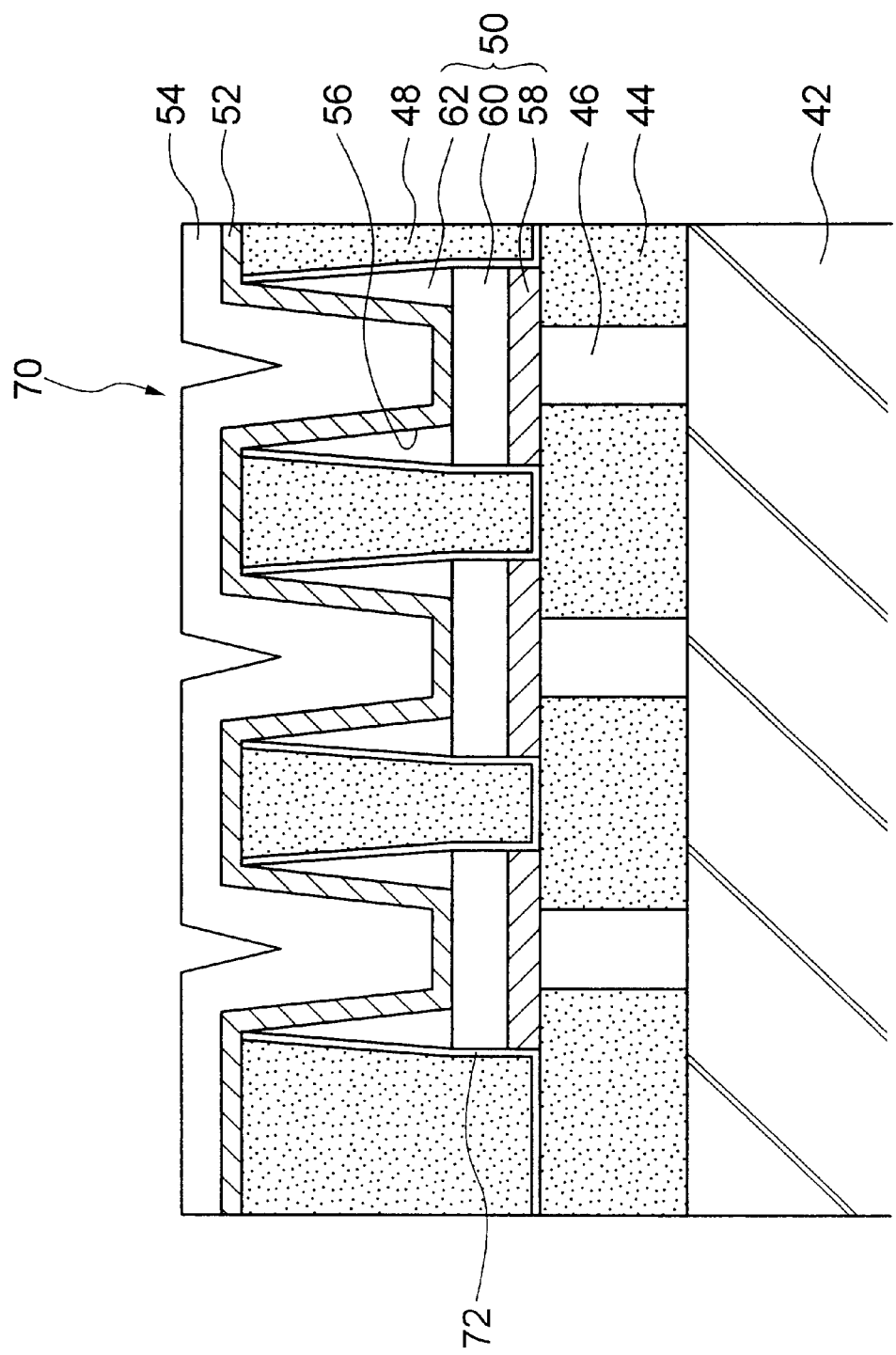

METHOD FOR FABRICATING STACKED CAPACITOR HAVING EXCELLENT ANTI-OXIDATION PROPERTY

BACKGROUND OF THE INVENTION (a) Field of the Invention

The present invention relates to a stacked capacitor and a method for fabricating a stacked capacitor in a semiconductor device. More specifically, the present invention relates to an improvement of characteristics of a stacked capacitor such as an anti-oxidation property and an electric resistance for the electrode thereof.

(b) Description of a Related Art

A semiconductor integrated circuit, such as a DRAM, often includes a stacked capacitor in a functional element constituting the semiconductor integrated circuit. It is desired along with the development of higher integration and finer patterning of the semiconductor device that the dimensions of the capacitor be reduced.

The technique for reduction of the dimensions of the capacitor is described in "1997 Symposium on VLSI Technology Digest of Technical Papers", pp 17 and 18, for example. In the publication, a stacked capacitor is proposed which includes a Ru film for each electrode of the stacked capacitor and a high permittivity film, such as BST film, as the capacitor insulator film.

FIGS. 1A to 1G consecutively show fabrication steps of a conventional stacked capacitor in a semiconductor integrated circuit. In fabrication of the stacked capacitor, a plurality via-holes each receiving therein a polysilicon plug 16 are formed in a first interlevel dielectric film 14, the polysilicon plug 16 being in contact with a diffused region formed in a semiconductor substrate 12. A SiN film 18 is then formed on the interlevel dielectric film 14, followed by deposition of a second interlevel dielectric film 20, whereby the structure shown in FIG. 1A is obtained. The SiN film 18 is used for improvement of adhesion between the first interlevel dielectric film 14 and the second interlevel dielectric film 20.

Subsequently, as shown in FIG. 1B, a photoresist film 24 is formed on the second interlevel dielectric film 20, followed by patterning thereof to form an etching mask 24 having openings 22 therein. The second interlevel dielectric film 20 and the SiN film 18 are then subjected to patterning using the etching mask 24 to form openings 26 each exposing the contact plug 16. Thereafter, a Ru film 28 is deposited by sputtering onto the entire area of the wafer including the inner walls of the openings 26 and on the top surface of the polysilicon plug 16 at the bottom of the opening 26.

The Ru film 28 is then subjected to a CMP process, thereby leaving a portion of the Ru film 28 as a bottom electrode on the inner wall and the bottom of the openings 26, as shown in FIG. 1E. An insulator film (BST film) 30 made of $(Ba,Sr)TiO_3$ is then deposited on the entire area by a CVD process in an oxygen ambient. Finally, a Ru film 32 is deposited by sputtering to form a top electrode 32, to obtain the structure shown in FIG. 1G.

There are following problems in the conventional fabrication process for the stacked capacitor as described above. First, a high contact resistance appears between the polysilicon plug 16 and the bottom Ru electrode 28. This is caused mainly by oxidation of the polysilicon plug 16 due to oxygen penetrating through the bottom Ru electrode 28 during CVD of the BST film 30. The Ru film 28 has poor characteristics in stopping the penetrating oxygen due to the poor crystalline orientation alignment thereof, which in turn is caused by deposition of the Ru film 28 onto the etched surface of the openings 26. In general, a metallic film formed on the etched surface has such a poor property. The high contact resistance reduces the read/write speed of a memory cell having the stacked capacitor.

Second, the bottom Ru electrode 28 is liable to peel-off from the inner wall of the openings 26 during the CMP process of the thin Ru film 28. Although the Ru film 28 has excellent adherence to polysilicon, the adherence of the Ru film 28 to the first interlevel dielectric film 20 made of $SiO_2$ is poor. The peel-off of the bottom Ru electrode 28 may reduce the capacitance of the resultant stacked capacitor.

Third, the impurities existing at the interface between the BST film 30 and the bottom Ru electrode 28 degrade the characteristics of the resultant capacitor. The impurities include fine particles of particle slurry or Ru film left at the interface within the openings after the CMP process for the Ru film 28. It is difficult in fact to entirely remove the remaining impurities after the CMP process. Similar situation will result if another precious metal or refractory metal is used instead of Ru.

In short, the conventional method does not provide a stacked capacitor having desired characteristics especailly for the electrodes.

SUMMARY OF THE INVENTION

In view of the above, it is an object of the present invention to provide a stacked capacitor having desired characteristics such as a low resistance and a higher capacitance between electrode and a method for fabricating such a stacked capacitor.

The present invention provides a stacked capacitor including a semiconductor substrate having a diffused region, a contact plug having a top surface and a bottom surface which is in contact with the diffused region, a bottom electrode in contact with the top surface of the contact plug, a capacitor insulator film formed on the bottom electrode, and a top electrode formed on the capacitor insulator film, the bottom electrode being substantially of a hollow cylindrical shape having an open top and a closed base, a vertical cross-section of the bottom electrode being substantially of a trapezoid in an outside profile thereof wherein the top of the bottom electrode has an outside dimension smaller than an outside dimension of the base of the bottom electrode.

The present invention also provides a method for fabricating a stacked capacitor including the steps of forming a first dielectric film having therein a contact plug in contact with a diffused region of a semiconductor substrate, depositing a bottom electrode layer on the first dielectric film and the contact plug, selectively etching the bottom electrode layer to form an island bottom electrode in contact with the contact plug, depositing a second dielectric film on the first dielectric film to embed the island bottom electrode, selectively etching the island bottom electrode to form a hollow cylindrical electrode having a closed bottom, depositing a capacitor insulator film on the second dielectric film and inside the hollow cylindrical electrode, and depositing a top electrode on the capacitor insulator film.

In accordance with the stacked capacitor of the present invention, the specific trapezoid shape of the bottom electrode in the vertical cross section thereof is not formed by deposition of a metallic material in an opening formed by an etching process. That is, the bottom electrode deposited on the even, smooth and non-etched surface has excellent crystalline orientation alignment.

Thus, the bottom electrode of the stacked capacitor of the present invention has excellent anti-oxidation property. This prevents the contact plug from being oxidized and increasing the contact resistance between the bottom electrode and the contact plug.

In addition, the bottom electrode is less liable to peeling-off from the dielectric film surrounding the bottom electrode because of the process wherein the bottom electrode having a hollow therein is not subjected to a CMP process. This provides the stacked capacitor with a stably high capacitance. The specific structure of the stacked capacitor of the present invention is generally formed by deposition of a metallic layer, followed by patterning thereof to form a hollow, as defined in the method of the present invention.

BRIEF DESCRIPTION OF THE DRAWINGS

FIG. 6 is a sectional view of a stacked capacitor according to a second embodiment of the present invention.

PREFERRED EMBODIMENTS OF THE INVENTION

Figure 1A:
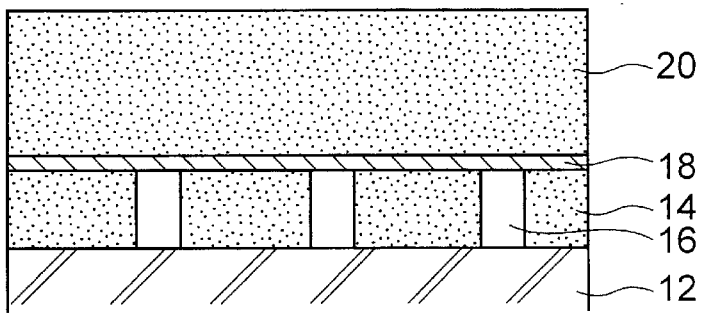
FIGS. 1A to 1G are sectional views of a stacked capacitor in consecutive steps of a conventional method for fabrication thereof.
Figure 1B:
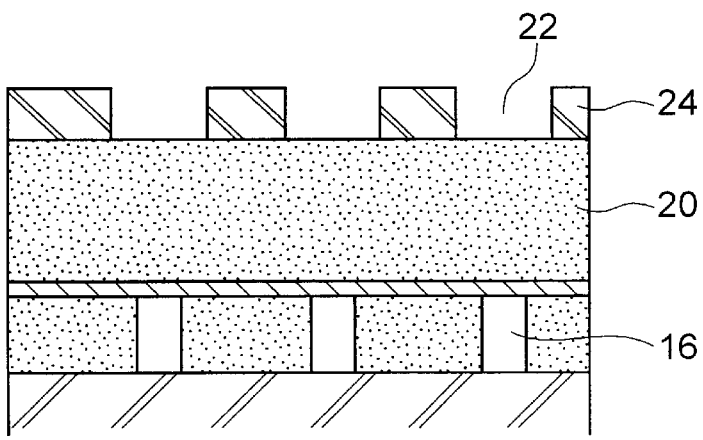
Figure 1C:
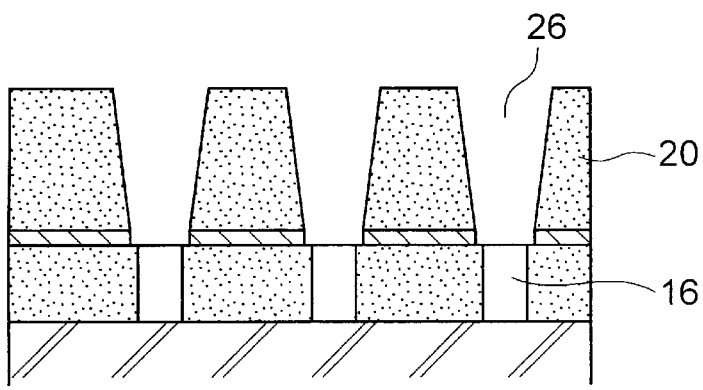
Figure 1D:
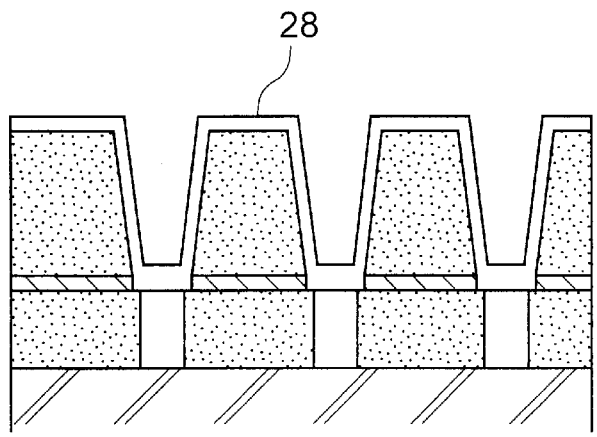
Figure 1E:
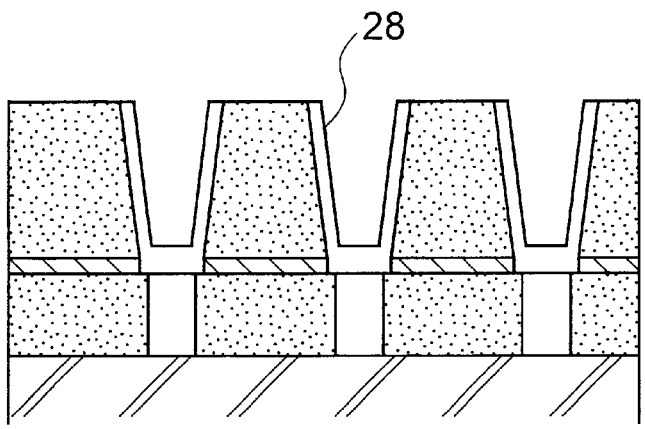
Figure 1F:
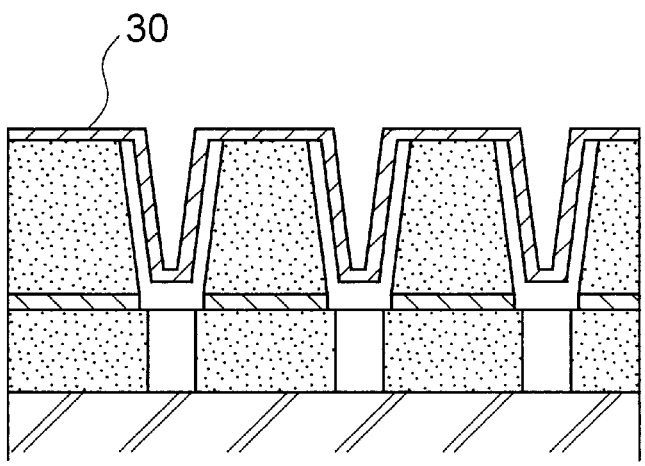
Figure 1G:
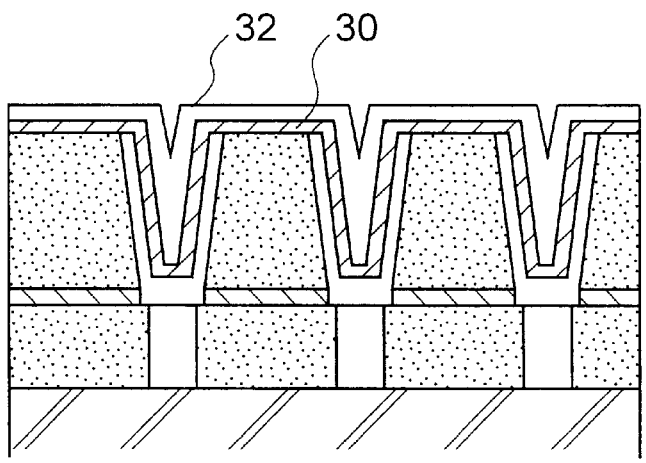

In the stacked capacitor of the present invention, the top electrode and the bottom electrode preferably includes one or more of precious metals, such as Pt, Ru, Ir and Os, refractory metals, such as W, Cr, Mo, Re and Rh, conductive oxides of each of the precious metals or refractory metals such as recited herein, mixed-crystal metals including two or more of the metals such as recited herein, and conductive oxides of mixed-crystal metals such as recited herein.

The conductive oxides include, for example, $RuO_2$, $IrO_2$, $OsO_2$. The mixed-crystal metals include, for example, $Ru_xIr_{1-x}$ and $Ru_xOs_{1-x}$.

The bottom electrode may preferably includes one or more of conductive oxides each having a perovskite structure expressed by a general formula $ABO_3$, wherein "A" represents Eu, Sr, La, Ca, Re, Ba or Er, for example, and "B" represents Nb, Ir, Ti, Ni, Cr, Ru, Mo, Co, V, W, Fe or Pb, for example. Typical conductive oxides having a perovskite structure include $SrRuO_3$, $SrCrO_3$ and $BaPbO_3$, for example.

The bottom electrode may preferably include one or more of conductive oxides each having a pyrochlore structure expressed by a general formula $A_2B_2O_7$, wherein "A" represents Ln, Bi, Cd, Lu, Bi, Pb or Ti, for example, and "B" represents Os, Rh, Re, Ru or Ir, for example. Typical conductive oxides having a pyrochlore structure include $Pb_2Os_2O_7$ and $Bi_2Ru_2O_7$, for example.

In view of the etching feasibility, W, Ru, $RuO_2$, and $IrO_2$ are most preferable, and Pt, Ir, Os and the oxides thereof are more preferable for the material of the bottom electrode. Alternatively, in view of the anti-oxidation property, Ir, Os, Cr, Mo, Re and Rh are preferable.

It is preferable that an adhesion layer, such as made of SiNx, be interposed between the side wall of the bottom electrode and the surrounding dielectric film. The adhesion layer further assures prevention of the bottom electrode from peeling-off from the dielectric film surrounding the same.

The outside profile of the bottom electrode in a horizontal cross-section may be of any shape, such as a circle, rectangle, square and any polygon.

The body of the bottom electrode may include a first electrode layer and a second electrode layer, wherein the first electrode layer preferably has a low etching rate compared to the second electrode layer in a selected etching condition. This configuration affords an advantage of the etching feasibility of the bottom electrode for forming a hollow therein. The bottom electrode may further include a barrier metal layer underlying the body of the bottom electrode.

The barrier metal layer may include one or more of Ti, Ta, W, and a nitride of each of these metals. Preferable barrier metal layer has a two-film structure such as TiN/Ti, TaNx/Ti and TaNx/Ta. The two-film structure of the barrier metal layer further assures prevention of oxygen from penetrating through the bottom electrode toward the contact plug.

The second electrode layer of the bottom electrode may preferably include an element which is absent in the first electrode layer, for allowing the etch end point of the second electrode layer to be detected at the top of the first electrode layer by using an etching monitor.

A conductive oxide of a metal, if used for the first electrode layer of the bottom electrode in direct contact with the barrier metal layer, may oxidize the barrier metal layer and the underlying contact plug due to the oxygen included in the conductive oxide. Thus, the conductive oxide layer should be used as the second electrode layer of the bottom electrode and not as the first electrode layer.

Ir or mixed-crystal metals including Ir is preferably used for the first electrode layer because Ir has a higher anti-oxidation property compared to Ru.

The first electrode layer is preferably used as an etch stop layer. In this case, the second electrode layer should have a higher etching rate compared to the first electrode layer, at least under the selected etching conditions.

At least a part of the capacitor insulator film interposed between the bottom electrode and the top electrode in the stacked capacitor may preferably include one or more of compounds expressed by a general formula $ABO_3$, wherein "A" is selected from one or more of Ba, Sr, Pb, Ca, La, Li and K, and "B" is selected from one or more of Zr, Ti, Ta, Nb, Mg, Mn, Fe, Zn and W, a material expressed by a general formula $(Bi_2O_2)(A_{m-1}B_mO_{3m+1})$, wherein "A" is selected from one or more of Ba, Sr, Pb, Ca, K and Bi, "B" is selected from one or more of Nb, Ta, Ti and W, and m=1 to 5, and/or $Ta_2O_5$. For example, a high-permittivity oxide film or a ferroelectric oxide film well known heretofore, such as including $(Ba,Sr)TiO_3$, $Ta_2O_5$ and $Pb(Zr,Ti)O_3$ and $SrBi_2TaO_9$, may be preferably used for the capacitor insulator film.

Now, the present invention is more specifically described with reference to accompanying drawings.

Figure 2:
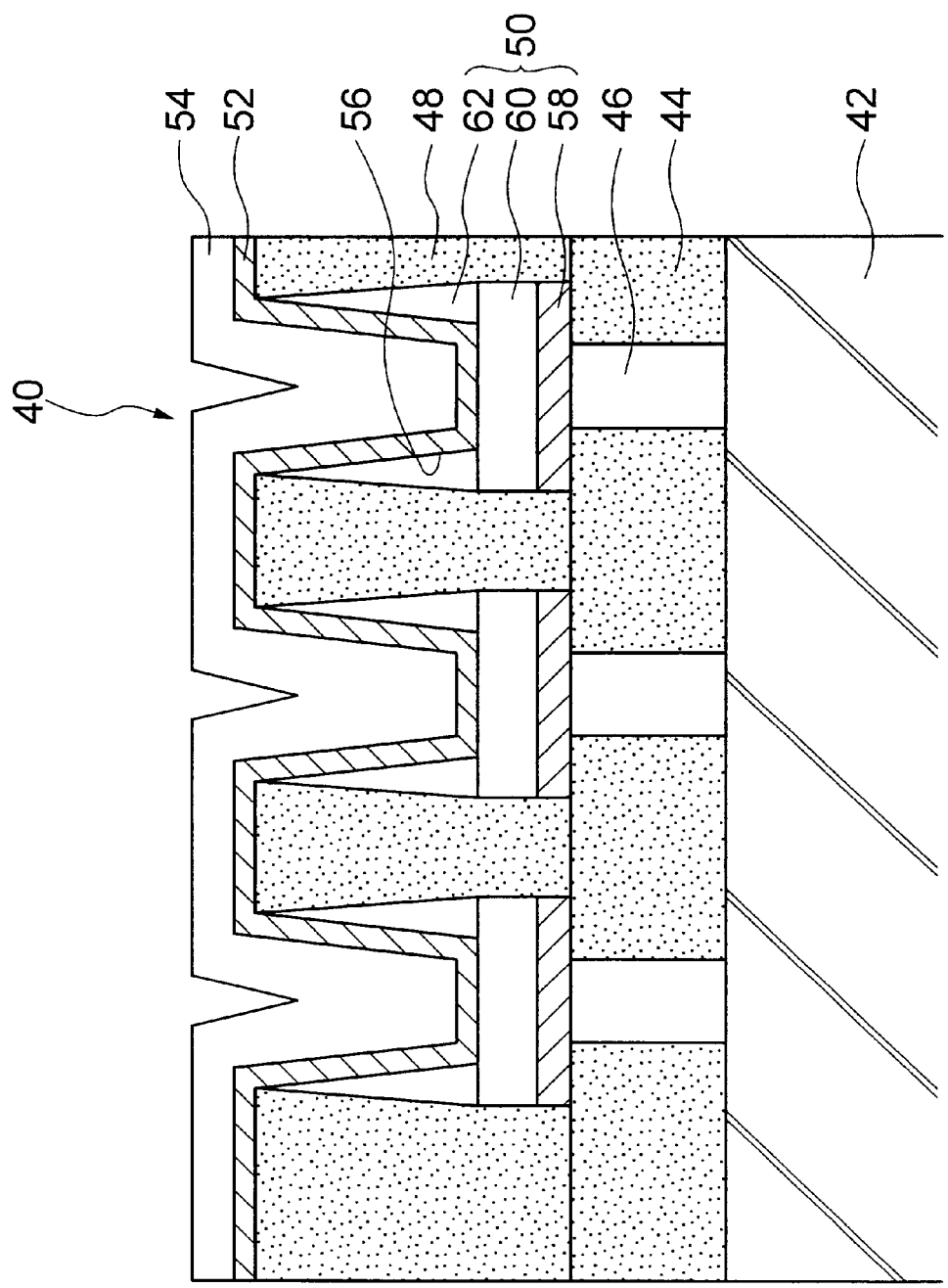
FIG. 2 is a sectional view of a stacked capacitor according to a first embodiment of the present invention.

Referring to FIG. 2, a stacked capacitor according to a first embodiment of the present invention includes a silicon substrate 42 having therein a diffused region such as a source or a drain, a first interlevel dielectric film 44 formed on the silicon substrate 42 and having a via-hole receiving therein a contact plug 46, and a second interlevel dielectric film 48 formed on the first interlevel dielectric film 44. The second interlevel dielectric film 44 embeds a bottom electrode 50 of the stacked capacitor.

The contact plug 46 is made of polysilicon and has a base in contact with the diffused region formed in the silicon substrate 42. The contact plug 46 has a top in direct contact with the bottom electrode 50. The bottom electrode 50 is substantially of a hollow cylindrical shape having an open top and a closed base, which is in direct contact with the contact plug 46. The vertical cross-section of the bottom electrode 50 is substantially of a trapezoid in the outside profile thereof, wherein the outside dimension of the top is smaller than the outside dimension of the base.

The bottom electrode 50 includes a barrier metal layer 58 and a two-film body structure including a first electrode layer 60 containing Ir and a second electrode layer 62 containing Ru, which are consecutively formed on the barrier metal layer 58. The second electrode layer 62 forms a sidewall of the hollow-cylindrical bottom electrode 50, and has a vertical cross-section which is of a triangle having a top acute angle.

The base of the bottom electrode 50 is implemented by the barrier metal layer 58 and the first electrode layer 60. The barrier metal layer 58 has a two-film structure including TiN/Ti, which has an excellent adherence to the first interlayer dielectric film 44 and functions as a barrier for preventing silicon and oxygen from penetrating therethrough.

In manufacture of the stacked capacitor of the present embodiment, the barrier metal layer 58 is deposited on the first interlevel dielectric film 44, followed by deposition of the first electrode layer 60 thereon. The barrier layer 58, having an even and smooth top surface which is not subjected to a CMP process, affords an excellent crystalline structure of the first electrode layer 60 and thus provides excellent anti-oxidation property thereto. Due to this structure along with the property of the barrier metal layer, 58 which prevents penetration of oxygen, the underlying contact plug 46 is scarcely oxidized during CVD of the BST film 52. Thus, the stacked capacitor is free from a higher resistance of the electrodes as encountered in the conventional stacked capacitor.

In addition, the second electrode layer 62 made of Ru can be selectively etched to form a hollow therein by a substantially self-alignment process using the second interlevel dielectric film 48 embedding the bottom electrode 50 as an etching mask. This saves a photolithographic step. Moreover, the first electrode layer 60 functions as an etch stopper during etching of the second electrode layer 62 because the first electrode layer 60 made of Ir has a lower etching rate compared to the second electrode layer 62 made of Ru.

Furthermore, since the CMP process is not conducted to the bottom electrode 50 having a hollow therein, the peel-off of the bottom electrode 50 from the second interlevel dielectric film 48 as encountered in the conventional device can be prevented.

With reference to FIGS. 3A to 3G, a method according to an embodiment of the present invention will be detailed for an exemplified case of fabrication of the stacked capacitor of FIG. 2. A first interlevel dielectric film 44 is formed on a silicon substrate 42, followed by patterning thereof to form a via-hole for receiving therein a contact plug 46 having a base in contact with a diffused region of the silicon substrate 42.

Figure 3A:
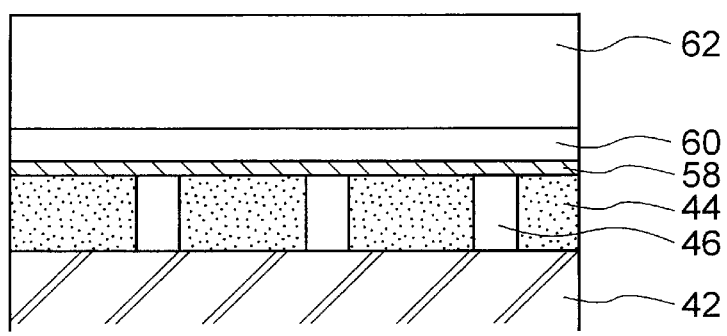
FIGS. 3A to 3G are sectional views of the stacked capacitor of FIG. 2 in consecutive steps of a method for fabrication thereof.

Subsequently, a 50-nm-thick TiN film and a 50-nm-thick Ti film are consecutively deposited using a DC magnetron sputtering process on the first interlevel dielectric film 44 to form a barrier metal layer 58, which is in contact with the top of the contact plug 46. A first electrode layer 60 made of Ir having a thickness of 80 nm and a second electrode layer 62 made of Ru having a thickness of 400 nm are consecutively deposited thereon using a DC magnetron sputtering process, as shown in FIG. 3A.

Figure 3B:
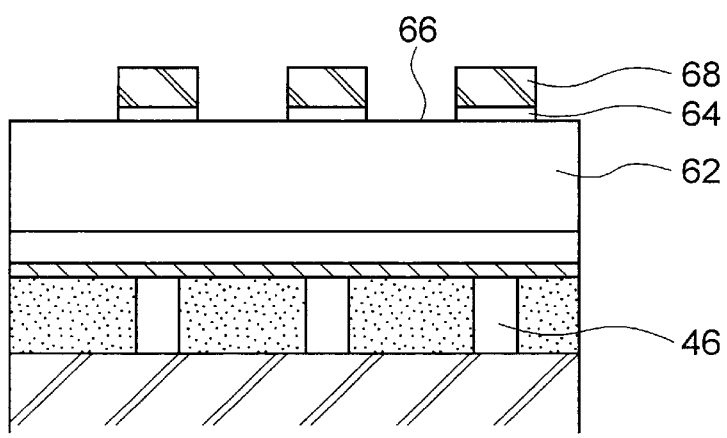

A $SiO_2$ film 64 is then deposited on the second electrode layer 62 to a thickness of 400 nm by using a RF magnetron sputtering process at a room temperature. A photoresist film 68 is then formed on the $SiO_2$ film 64, followed by patterning thereof using a photolithographic technique to form a mask pattern 68 having therein openings 66. The $SiO_2$ film 64 is then subjected to a reactive ion etching (RIE) process using a mixture of $CHF_3$ and $O_2$ mixed at a ratio of 40:1, to form an etching mask 64 having therein openings 66, as shown in FIG. 3B.

The etching mask 64 has a pattern that allows the second electrode layer 62, the first electrode layer 60 and the barrier metal layer 58 to make island bottom electrodes 50 and to expose the underlying first interlevel dielectric film 44 between the island bottom electrodes 50.

Figure 3C:
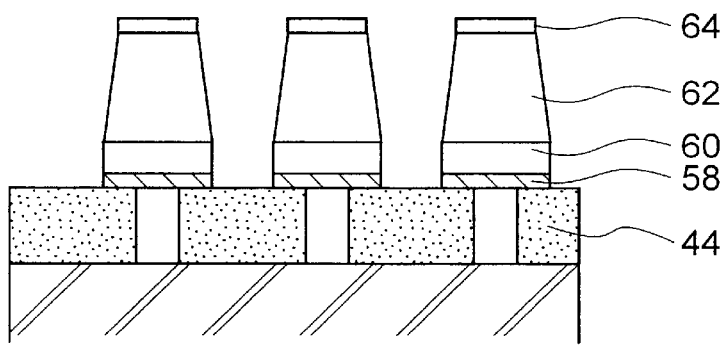

The photoresist mask 68 is removed by oxygen ashing, followed by selective etching of the first and the second electrode layers 60 and 62 by a RIE process using the etching mask 64 and a mixture of $Cl_2$ and $O_2$ mixed at a ratio of 1:9. With the etching mask 64 remaining as it is, the barrier metal layer 58 is then patterned using a RIE process using $Cl_2$ as an etching gas. Thus, desired island bottom electrodes 50 are formed, as shown in FIG. 3C. The end point of the etching for the barrier metal layer 58 is detected by a monitor.

Subsequently, a second interlevel dielectric film 48 made of TEOS is deposited by a CVD process using $O_3$-TEOS gas on the exposed first interlevel dielectric film 44 for embedding the island bottom electrodes 50 up to the height of the bottom electrodes 50.

Figure 3D:
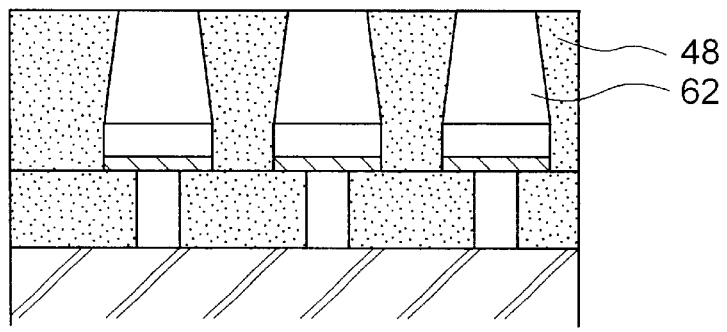
Figure 3E:
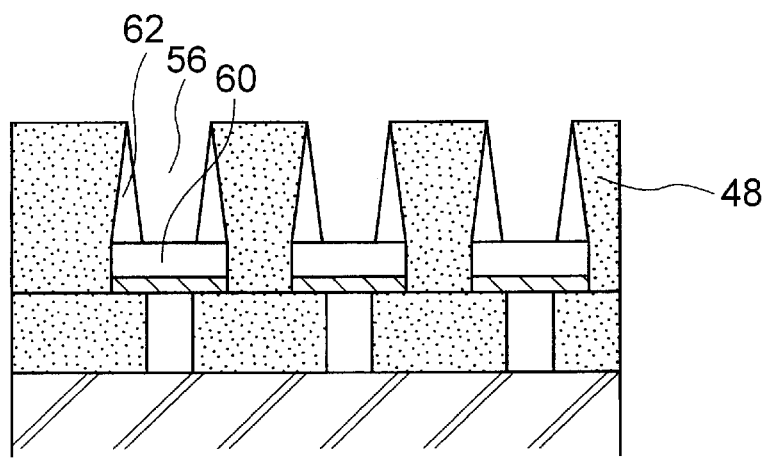

The second interlevel dielectric film 48 is then subjected to an annealing process in a nitrogen ambient for burning to reduce the volume thereof, followed by CMP of the top surface of the second interlevel dielectric film 48 and the bottom electrode 50 for planarization, whereby the second electrode layer 62 is exposed, as shown in FIG. 3D.

Then, the second electrode layer 62 is subjected to a RIE process for selectively etching, using the first electrode layer 60 as an etch stopper, the second interlevel dielectric film 48 as a mask and a mixture of $Cl_1/O_2$ (1:9) as an etching gas, form a hollow 56 therein. The etching conditions are as follows:

chamber pressure—15 mTorr;

microwave output power—220 watts; and

RF bias output power—150 watts.

Figure 3F:
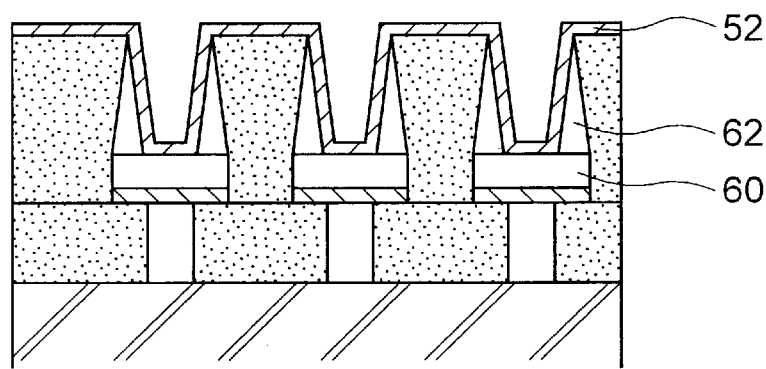

After a set of acid cleaning, water cleaning and drying is finished, a 30-nm-thick $(Ba_{0.5}Sr_{0.5})TiO_3$ film, or BST film, is deposited as a capacitor insulator film 52 on the entire area including inside the hollow of the bottom electrode 50 by a thermal CVD process at a substrate temperature of 440° C., as shown in FIG. 3F, followed by a rapid thermal process (RTP) at a temperature of 750° C. for one minute. Thus, the capacitor insulator film 52 is formed on the bottom and the inner sidewall of the bottom electrode 50.

Figure 3G:
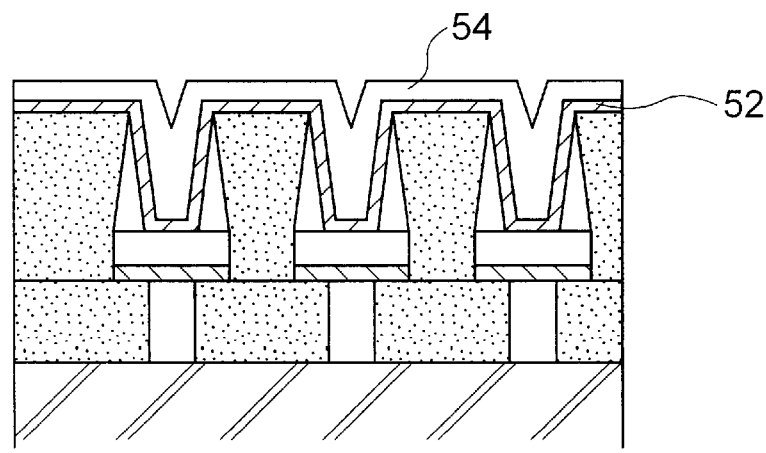

Subsequently, a top electrode 54 made of Ru film having a thickness of 500 nm is deposited on the capacitor insulator film 52 by using a DC magnetron sputtering process, thereby obtaining the final structure shown in FIG. 3G.

In the above embodiment, the thermal CVD process for depositing the capacitor insulator film 62 may be replaced by another process such as sputtering.

The smooth top surface of the barrier metal layer 58 formed as a non-etching surface affords excellent property of the first electrode layer 60, such as a crystalline orientation alignment and an anti-oxidation, whereby the high resistance of the contact plug 46 is avoided.

The self-alignment etching process for forming the hollow 56 within the second electrode layer 62 saves a photolithographic step.

The absence of the hollow in the second electrode layer 62 of the bottom electrode 50 during the CMP process affords prevention of peel-off of the bottom electrode 50 from the second interlevel dielectric film 48.

In the above embodiment, the first electrode layer 60 is used as an etch stopper during etching of the second electrode layer 62 for forming the hollow therein. However, if the bottom electrode 50 has a single layer structure formed on the barrier layer 58, the etching time may be controlled instead of providing the etch stopper during forming the hollow 56 in the bottom electrode 50. In addition, the barrier metal layer 58 may be omitted if the body of the bottom electrode 50 has an excellent anti-oxidation property itself.

A sample structure was defined for the purpose of evaluating the performance of the stacked capacitor of the present embodiment. The sample structure, as shown in FIG. 4, included a silicon substrate 42 having therein diffused regions 74, a contact plug 46, a bottom electrode 50A having a barrier metal layer 58 and a first electrode layer 60, first and second interlevel dielectric films 44 and 48 and an Al film 76, wherein the contact resistance between the bottom electrode 50 and the contact plug 46 was to be measured for evaluation of the performance of the stacked capacitor of the present embodiment.

The practical samples were fabricated as follows. The layer structure shown in FIG. 3A is formed on the p-type silicon substrate 42 having n$^+$-type diffused regions 74. Subsequently, the second electrode layer 62 was removed by etching using the conditions: chamber pressure—15 mTorr; microwave output power—220 watts; and RF bias output power—150 watts, similar to the conditions for forming the hollow in the bottom electrode 50 at the step of FIG. 3E. Then, a BST film was deposited, subjected to RTP under the conditions similar to the conditions for forming the BST film 52 at the step of FIG. 3F. The BST film was then removed by etching using a fluorine-based etchant.

Figure 4:
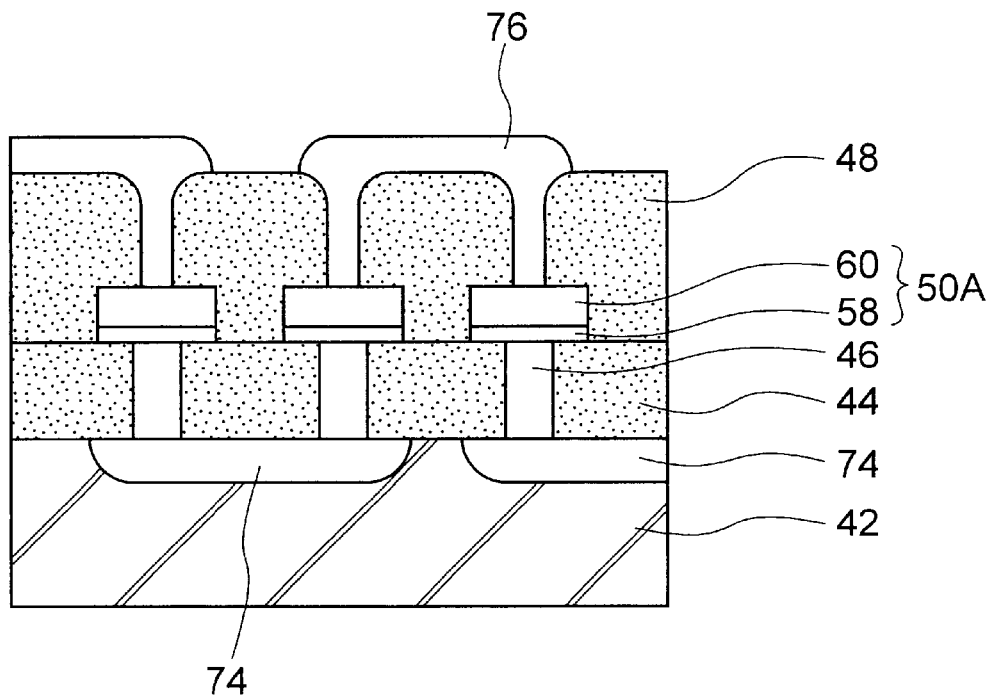
FIG. 4 is a sectional view of a sample of the present invention fabricated according to the method of the embodiment of the present invention.

Thereafter, the first electrode layer 60 was patterned by an Ar milling process to obtain the island bottom electrode 50A in contact with the contact plug 46, as shown in FIG. 4. The second interlevel dielectric film 48 was then deposited, followed by patterning thereof and subsequent deposition and patterning of the aluminum film 76. In addition, other thermal processes were applied similarly to a typical DRAM process, whereby the structure shown in FIG. 4 is obtained.

A plurality of combinations of the bottom electrode 50A, the contact plug 46 and the diffused region 74 were connected in series by the aluminum interconnects 76 and the n$^+$-type diffused regions 74, as shown in FIG. 4. 1000 units each having a circuit structure shown in FIG. 4 were connected in series to form a first sample; 2000 units were connected in series to form a second sample; and 3000 units were connected in series to form a third sample. These samples were subjected to measurement of the contact resistance therein.

The samples were also subjected to measurements just after deposition of the BST film 52 at the step of FIG. 3F and after the heat treatment thereof.

The results of the measurements depended on the fabrication process of the stacked capacitor. However, the results of the measurements had no significant difference between the steps of the process in each sample, which exhibited that the contact resistance did not substantially change through the fabrication process. These facts revealed that the oxidation of the contact plug 46 did not occur in these fabricated samples.

Figure 5:
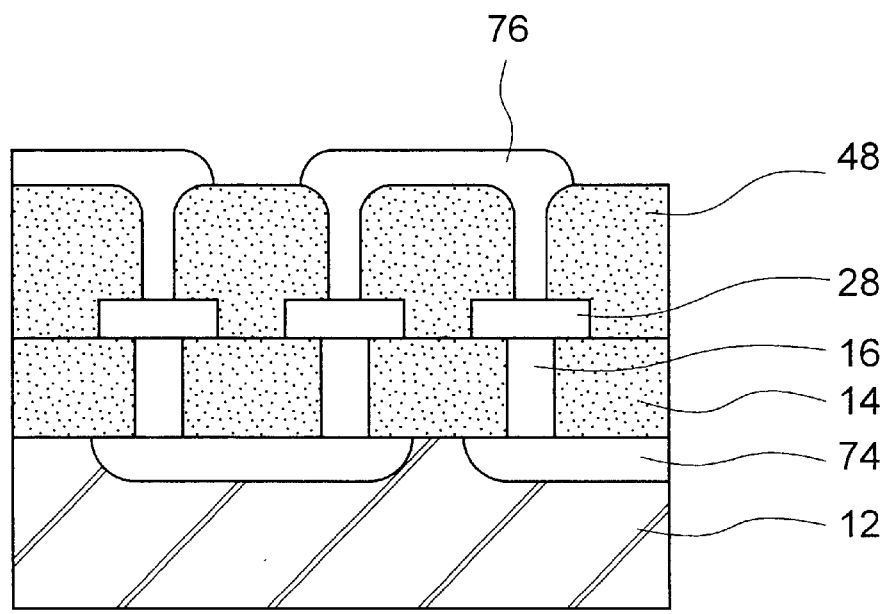
FIG. 5 is a sectional view of a comparative sample fabricated by a conventional method for comparison of the sample of FIG. 4.

Comparative samples each having a unit structure shown in FIG. 5 were also fabricated by using the conventional process as recited with reference to FIGS. 1A to 1G. These comparative samples were also subjected to measurements of the contact resistance similarly to the samples of the embodiment. Each of the measurements exhibited an open circuit failure or at least a higher contact resistance in the order of mega-ohms. Thus, the advantage of the present invention could be affirmed.

Referring to FIG. 6, a stacked capacitor 70 according to a second embodiment of the present invention is similar to the first embodiment except for a SiNx film 72 interposed between the bottom electrode 50 and the second interlevel dielectric film 48 in the second embodiment.

The SiNx film 72 functions as an adhesion layer which improves the adhesion between the bottom electrode 50, especially the second electrode layer 62 thereof, and the second interlevel dielectric film 48. The fabrication process for the second embodiment will be described below with reference to FIGS. 7A to 7C.

Figure 7A:
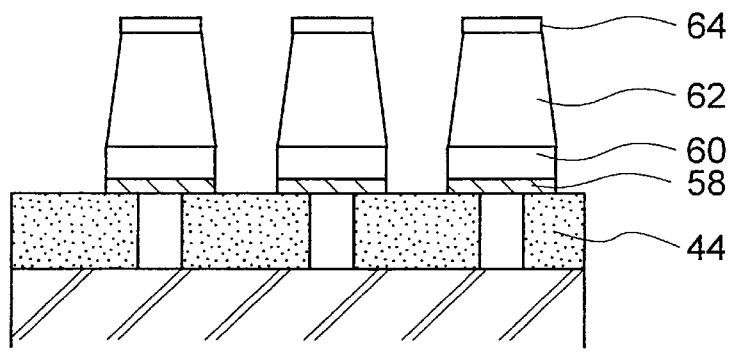
FIGS. 7A to 7C are sectional views of the stacked capacitor of FIG. 6 in consecutive steps of a method for fabrication thereof.
Figure 7B:
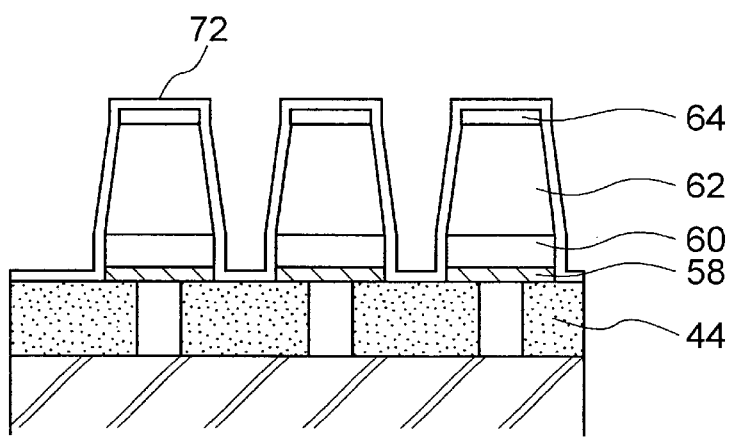

The fabrication process includes the steps of deposition of the first interlevel dielectric film 44, formation of the contact plug 46, deposition of the barrier metal layer 58, the first electrode layer 60, and the second electrode layer 62, and patterning thereof to form island bottom electrodes 50 and expose the first interlevel dielectric film 44 between the island bottom electrodes 50, thereby obtaining the structure shown in FIG. 7A.

Figure 7C:
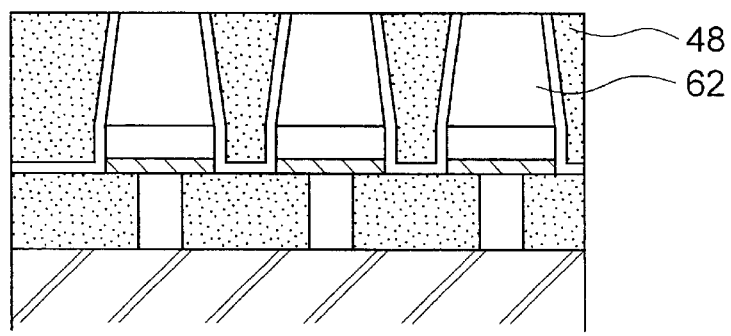

Subsequently, a SiNx film 72 is deposited on the entire area by a CVD process. Then, a second interlevel dielectric film 48 made of TEOS is deposited by a CVD process using an O$_3$-TEOS gas to embed the island bottom electrodes 50 up to the top surface of the island bottom electrodes 50. The second interlevel dielectric film 48 is then subjected to annealing in a nitrogen ambient for burning to reduce the volume thereof, followed by CMP of the second interlevel dielectric film 48 and the mask 64 for planarization to expose the second interlevel dielectric film 48 between the island bottom electrodes 50, as shown in FIG. 7C. The following procedure is similar to those in the first embodiment.

Although the contact plug 46 and the barrier metal layer 58 are made of polysilicon and TiN/Ti, respectively, in the first and second embodiments, the contact plug 46 may be implemented by one or more layers of Ta, Ti, W, and a nitride or silicide of each of these metals, and the barrier metal layer 58 may be implemented by one or more layers of Ta, Ti, W, and a nitride of each of these metals. In addition, the barrier metal layer 58 and the contact plug 46 may be made of a single material without separation at the level of the top surface of the first interlayer dielectric film 44.

Since the above embodiments are described only for examples, the present invention is not limited to the above embodiments and various modifications or alterations can be easily made therefrom by those skilled in the art without departing from the scope of the present invention.

What is claimed is:

1. A method for fabricating a stacked capacitor comprising the steps of forming a first dielectric film having therein a contact plug in contact with a diffused region of a semiconductor substrate, depositing a bottom electrode layer on the first dielectric film and the contact plug, selectively etching the bottom electrode layer to form an island bottom electrode in contact with the contact plug, depositing a second dielectric film on the first dielectric film to embed the island bottom electrode, selectively etching the island bottom electrode to form a hollow cylindrical electrode having a closed bottom, depositing a capacitor insulator film on the second dielectric film and inside the hollow cylindrical electrode, and depositing a top electrode on the capacitor insulator film.

2. The method as defined in claim 1, further comprising the step of depositing an adhesion layer between the step of selectively etching and the step of depositing the second dielectric film.

3. The method as defined in claim 1, wherein the bottom electrode layer includes a barrier metal layer and a electrode body layer.

4. The method as defined in claim 2, wherein the electrode body layer includes a first electrode layer and a second electrode layer overlying the first electrode layer, the first electrode layer having a lower etching rate compared to the second electrode layer.

5. The method as defined in claim 4, wherein the barrier metal layer includes one or more of Ti, Ta, W, a nitride of each of these metals, the first electrode layer includes Ir and the second electrode layer includes Ru.

6. The method as defined in claim 5, wherein the barrier metal layer has a two-layer structure defined by one of TiN/Ti, TaNx/Ti, and TaNx/Ta.

* * * * *